Jan. 31, 1967 J. R. SCHWEICKERT 3,302,123
MICROWAVE CONSTANT GAIN LINEAR BANDPASS AMPLIFIER
Filed Dec. 23, 1963
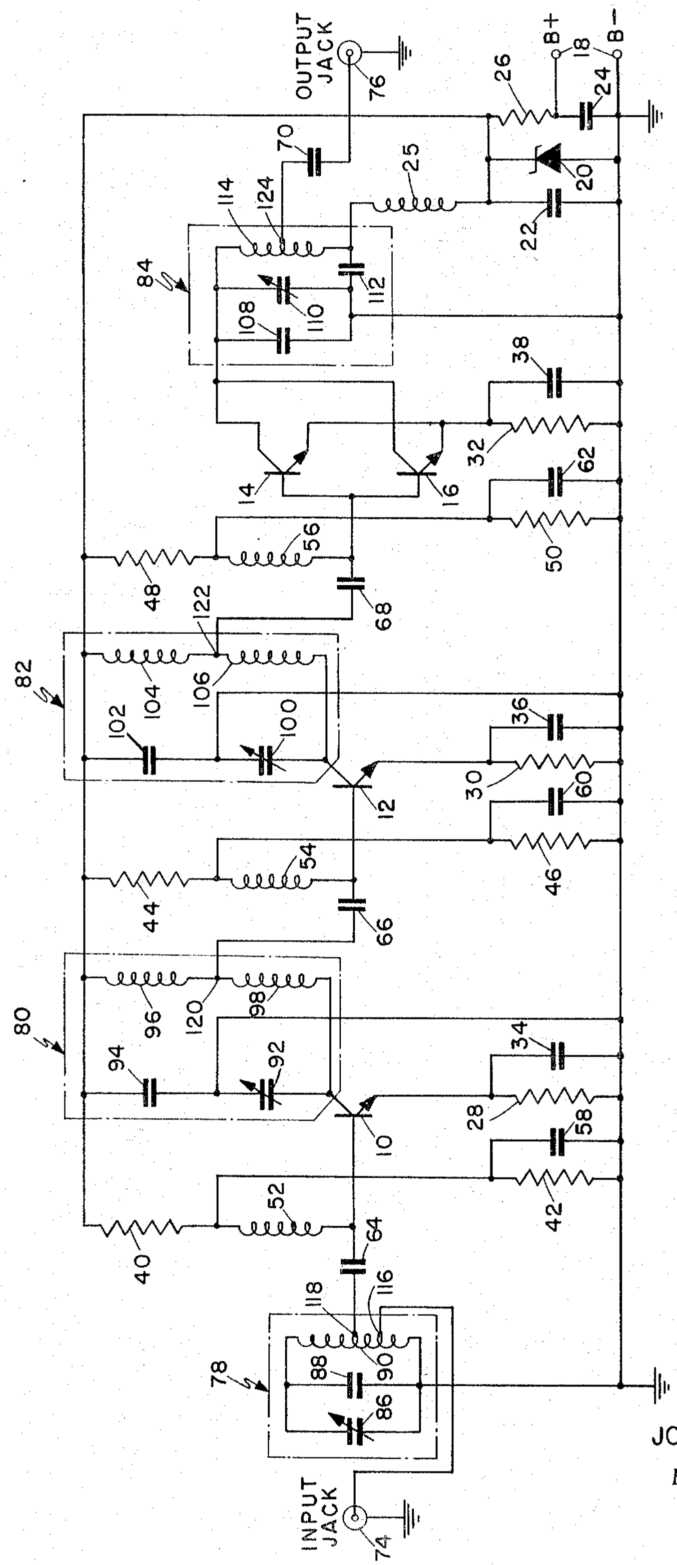
INVENTOR.
JOHN R. SCHWEICKERT
BY
Knox & Knox

United States Patent Office 3,302,123

Patented Jan. 31, 1967

3,302,123

MICROWAVE CONSTANT GAIN LINEAR BANDPASS AMPLIFIER

John R. Schweickert, Escondido, Calif., assignor to The Ryan Aeronautical Co., San Diego, Calif.

Filed Dec. 23, 1963, Ser. No. 332,637
2 Claims. (Cl. 330—21)

This invention relates generally to radio frequency amplifiers and particularly to a stable VHF-UHF linear amplifier that provides constant gain within a flat bandwidth.

*Background*

Microwave amplifiers inherently are notoriously unstable under ordinary operating conditions, high Q tuned circuits being subject to drift and sustain oscillations with resultant distortion, loss of gain, and generally erratic operation. Under extreme operating conditions, such as prevail in aircraft and missiles, microwave amplifiers require complex circuitry, means for protection against shock and vibration, and means insulating the amplifier from wide changes in temperature.

While operation of microwave amplifiers using precisely designed circuitry and special microwave vacuum tubes such as the traveling wave tube, is generally satisfactory, numerous failures occur when the vacuum tubes are submitted to excessive shock, vibration, or acceleration. Consequently, operation of vacuum tube microwave amplifiers in aircraft and missles is unreliable.

Microwave amplifiers using solid state transistors, printed circuit boards, and other especially developed techniques are superior to vacuum tubes in virtually all adverse environmental conditions except changing temperature. Circuitry techniques previously used with vacuum tubes, however, often must be modified or completely changed when transistors are used. Also the circuitry requirements for stable operation of microwave transistor amplifiers are at least as stringent as when vacuum tubes are used.

The instant invention is a multi-stage microwave transistor amplifier in which the transistors are biased for linear amplification, the bias is self-compensating for wide changes in temperature, and the stages are coupled by novel impedance matching techniques to provide stable operation with flat bandpass and constant gain.

*Objects*

It is a principal object of this invention to provide a microwave amplifier capable of stable operation at very high and ultra high frequencies within a wide range of negative and positive temperatures.

It is another object of this invention to provide a stable microwave amplifier having a symmetrically flat bandpass characteristic.

It is yet another object of this invention to provide a stable, linear microwave amplifier capable of constant gain under varying temperature conditions.

With these and other objects definitely in view, this invention consists in the novel combination and arrangement of elements as will be hereinafter fully described in the specification, particularly pointed out in the claims, and illustrated in the drawings that form a material part of this disclosure, and in which the single figure is a schematic drawing showing all details of the invention.

*Detailed description*

Referring to the drawing, transistors 10–16 are biased for class A, linear amplification, the bias of successive stages being adjusted to permit progressively increased current gain. Transistors 14 and 16 are connected in parallel to double the current handling capacity of the output stage. While NPN junction transistors are shown, PNP junction or other types of transistors may be used.

Regulated power, indicated generally at 18, provides base and collector bias voltages for transistors 10–16, the supply voltage being regulated by zener diode 20 and filtered by capacitors 22 and 24 and choke 25. Resistor 26 reduces the bias voltage applied to the bases and collectors of transistors 10–16.

Emitter bias for transistor 10–16, which opposes changes in transistor current caused by changes in temperature, is supplied by resistors 28–32, A.C. variations being bypassed by capacitors 34–38.

Base bias for transistors 10–16 is supplied by voltage divider resistor pairs 40–42, 44–46, and 48–50, increased base current caused by changes in temperature being opposed by said bias. Choke coils 52–56 and capacitors 58–62 respectively oppose and bypass A.C. variations in the base bias circuits.

Coupling capacitors 64–70 isolate the D.C. bias voltages from the A.C. signal circuits and couple the A.C. signal from the input through the successive amplifier stages to the output.

Coaxial jacks 74 and 76 connect the input and output of the amplifier to impedance matching transmission lines, which are not shown.

Input, output, and interstage impedance matching is achieved uniquely by the combination of components and method of connecting resonant circuits 78–84. Resonant circuit 78 includes variable capacitor 86 in parallel with fixed capacitor 88 and fixed, tapped inductor 90. Resonant circuit 80 includes series-connected variable capacitor 92 and fixed capacitor 94 in parallel with series-connected fixed inductors 96 and 98. Resonant circuit 82 includes series-connected variable capacitor 100 and fixed capacitor 102 in parallel with fixed inductors 104 and 106. Resonant circuit 84 includes parallel-connected fixed capacitor 108 and variable capacitor 110 in series with fixed capacitor 112, said capacitors being in parallel with fixed, tapped inductor 114.

In operation, resonant circuits 78–84 are tuned to the frequency of an input signal which may have a frequency typically within a 200–500 megacycle range, although these are not necessarily the lower and upper frequency limits. Assuming the frequency selected is 220 mcs., it is essential that resonant circuits 78–84 be tuned precisely to 220 mcs. It is also essential, however, that circuits 78–84 have a flat bandpass characteristic arranged symmetrically approximately 5 mcs. above and 5 mcs. below 220 mcs. This bandpass characteristic is necessary to ensure that input signals are amplified and produced in the amplifier output with exactly the same waveform as received, allowing in the band width for minor shifting of the input signal frequency or the center frequency to which resonant circuits 78–84 are tuned.

Input signals are fed to resonant circuit 78 through input jack 74 and tap 116 on inductor 90, a portion of inductor 90 thus matching the impedance of a transmission line or other input signal coupling device connected to jack 74. Resonant circuit 78 selects the signals having a frequency of 220 mcs. and rejects all others. The selected signals then are coupled to transistor 10 by capacitor 64 and tap 118, the attachment position of tap 118 on inductor 90 having been carefully adjusted to resonate a portion of the inductance of inductor 90 with the input capacitance of transistor 10, thus canceling the effect of the input capacitance and matching the high impedance of resonant circuit 78 to the low input impedance of transistor 10. This impedance matching provides two main results: first, increasing the circuit gain, particularly at the upper frequency limit; and second, increasing the bandwidth of resonant circuit 78 by reflecting low impedance into and lowering the Q of said circuit. Thus, initially, input signals are selected and passed through the relatively flat bandwidth of resonant circuit 78.

Resonant circuit 80 provides a high impedance tank circuit load for the output of transistor 10, thus providing maximum amplification with constant gain at the frequency of the input signals. Additionally, resonant circuit 80 tank oscillatory operation eliminates any distortion that might be superimposed on the input signal waveform by nonlinear current changes in transistor 10.

Essentially, resonant circuit 80 is a high Q tank circuit having a very narrow bandwidth and a capability for maintaining sustained oscillations after input signals are removed. It is necessary, therefore, to widen the bandwidth and suppress oscillations by lowering the circuit Q. To flatten the bandpass response, it also is necessary to eliminate the effect of circuit shunting capacitance and the input capacitance of transistor 12. The desired results may be achieved by canceling the capacitive effect with an equal and opposite inductive effect and reflecting low impedance into resonant circuit 80.

These results are achieved simultaneously and uniquely in a manner similar to that described for resonant circuit 78 and transistor 10. The inductance of inductor 96 is selected to resonate with the input capacitance of transistor 12, thus forming a low impedance series resonant circuit at the input signal frequency. In this manner, transistor 12 input reactive losses are eliminated, increasing the gain; and increased base current through inductor 96, when signals are coupled to transistor 12 by capacitor 66 and tap 120, lowers the Q of resonant circuit 80, widening the bandpass and suppressing sustained oscillations.

From the foregoing discussion it is apparent that inductor 96 performs a dual function. First, in combination with inductor 98 and capacitors 92 and 94, inductor 96 forms a high impedance parallel resonant circuit load for transistor 10. At the same time, in combination with the input capacitance of transistor 12, inductor 96 forms a low impedance series resonant circuit matching the high impedance of resonant circuit 80 with the low input impedance of transistor 12, providing the combined beneficial results as described.

The operation of transistors 14 and 16, resonant circuit 82, and inductor 104 are the same as for transistor 12, resonant circuit 80, and inductor 96, the amplified signals from transistor 10 being further amplified by transistor 12 and applied by capacitor 68 and tap 122 to parallel connected transistors 14 and 16.

Resonant circuit 84 is tuned to the same frequency as resonant circuits 78–82 to provide a high impedance load for transistors 14 and 16 in the manner described for resonant circuits 80 and 82. Output signals are coupled by capacitor 20 and tap 124 to output jack 76 for further connection to a transmission line, which is not shown. Tap 124 is attached to a point on inductor 114 so that a portion of inductor 114 matches the impedance of the transmission line. Impedance reflected by means of the transmission line and said portion of inductor 114 maintains the bandwidth and constant gain as described.

From the foregoing, it is apparent that the Q and bandwidth of resonant circuits 78–84 are determined initially by circuit constants; then altered by reflected impedance, which is dependant on input signals. Initially, therefore, the Q is high and the bandwidth narrow, making the amplifier highly selective to signals at the resonant frequency, the selectivity being further increased by the unique combination of parallel resonant and series resonant circuits as described. Signals received at the resonant frequency then lower the Q and widen the bandpass of the parallel resonant circuits 78–84 to provide a flat bandwidth with constant gain. By this means, in combination with the temperature stabilized transistors, microwave signals are selected, amplified, and produced in the output of the amplifier without distortion of the input waveform under varying temperature conditions.

It is understood that minor variation from the form of the invention disclosed herein may be made without departure from the spirit and scope of the invention, and that the specification and drawing are to be considered as merely illustrative rather than limiting.

I claim:

1. A three-stage transistor microwave amplifier, comprising:

a first transistor having means for stable bias and linear operation under varying temperatures;

a first resonant circuit coupling an input signal to said first transistor, said resonant circuit including inductor means for matching the impedance of an input signal coupling device and inductor means resonating with the input capacitance of said first transistor to increase the gain and widen the linear bandwidth of said first resonant circuit;

a second transistor having means for stable bias and linear operation under varying temperatures;

a second resonant circuit coupling the output of said first transistor to the input of said second transistor, said second resonant circuit being tuned to the same frequency as said first resonant circuit to provide a high impedance matching the high output impedance of said first transistor, said second resonant circuit including inductor means resonating with the input capacitance of said second transistor to increase the gain and widen the linear bandwidth of said second resonant circuit;

third and fourth parallel connected transistors having means for stable bias and linear operation under varying temperatures;

a third resonant circuit coupling the output of said second transistor to the input of said third and fourth transistors, said third resonant circuit being tuned to the same frequency as said second resonant circuit to provide a high impedance matching the high output impedance of said second transistor, said third resonant circuit including inductor means resonating with the input capacitance of said third and fourth transistors to increase the gain and widen the linear bandwidth of said third resonant circuit; and a fourth resonant circuit coupling the output of said third and fourth transistors to an output signal coupling device, said fourth resonant circuit being tuned to the same frequency as said third resonant circuit to provide a high impedance matching the high output impedance of said third and fourth transistors, said fourth resonant circuit including inductor means matching the impedance of said output signal coupling device to increase the gain and widen the linear bandwidth of said fourth resonant circuit.

2. In a microwave amplifier, the combination comprising:

a first transistor having a base, a collector, and an emitter;

a first resonant circuit having a variable capacitor and a fixed inductor in parallel with said capacitor, said inductor having a first tap for connection to input signal coupling means and a second tap coupled with said base, the portion of said inductor between said first tap and an extremity of the inductor providing impedance matching between said first resonant circuit and said input signal coupling means, the portion of said inductor between said second tap and an extremity of the inductor providing inductance to resonate with the input capacitance of said first transistor;

a second transistor having a base, a collector, and an emitter;

a second resonant circuit having a variable capacitor and a pair of series-connected fixed inductors in parallel wtih said capacitor, said second resonant circuit bein connected in series with the collector of said first transistor and a D.C. source, the juncture of said inductors being coupled with the base of said second transistor, said first and second resonant circuits being tuned to the same frequency, the inductance of one of said inductors resonating with the input capacitance of said second transistor;

a third resonant circuit having a variable capacitor and a fixed inductor in parallel with said capacitor, said third resonant circuit being connected in series with the collector of said second transistor and a D.C. source, said inductor having a tap for connection to output signal coupling means, the portion of said inductor between said tap and an extremity of the inductor providing impedance matching between said third resonant circuit and said output signal coupling means, said third resonant circuit being tuned to the same frequency as said first and second resonant circuits;

a regulated D.C. source connected to said second and third resonant circuits to provide linear operating bias for said collectors;

a resistor and a capacitor in parallel therewith connected from each said emitter to ground to provide stable emitter linear operating bias under varying temperatures; and a pair of series-connected resistors connected across said D.C. source, a capacitor connected across one of said resistors, and an inductor connected from the juncture of said resistors to each said base to provide stable base linear operating bias under varying temperatures.

References Cited by the Examiner

UNITED STATES PATENTS 3,061,792 10/1962 Ebbinge ------------- 330—21

FOREIGN PATENTS 590,281 1/1960 Canada.

OTHER REFERENCES

Wright et al.: F–M Feedback . . . Electronics, Dec. 6, 1963, pages 66–68.

Chow: High-Frequency Transistor Amplifiers, Electronics, April 1954, pages 142–145.

ROY LAKE, *Primary Examiner.*

F. D. PARIS, J. B. MULLINS, *Assistant Examiners.*